(12) United States Patent
Yu et al.

(10) Patent No.: US 6,624,018 B1
(45) Date of Patent: Sep. 23, 2003

(54) METHOD OF FABRICATING A DRAM DEVICE FEATURING ALTERNATE FIN TYPE CAPACITOR STRUCTURES

(75) Inventors: Chih-Hsing Yu, Hsin-chu (TW); Chih-Yang Pai, Hsin-Chu (TW); Chia-Shiung Tsai, Hsin-chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 17 days.

(21) Appl. No.: 09/839,965

(22) Filed: Apr. 23, 2001

(51) Int. Cl.$^7$ .......................................... H01L 21/8242
(52) U.S. Cl. ........................................ 438/239; 438/243
(58) Field of Search ............................... 438/142, 238, 438/239, 243, 246, 254, 381, 396, 397

(56) References Cited

U.S. PATENT DOCUMENTS

| | | | |
|---|---|---|---|
| 5,153,813 A | * 10/1992 | Oehrlein et al. | 361/313 |
| 5,155,657 A | * 10/1992 | Oehrlein et al. | 361/313 |
| 5,753,948 A | * 5/1998 | Nguyen et al. | 257/307 |
| 5,817,553 A | * 10/1998 | Stengl et al. | 438/253 |
| 5,843,822 A | * 12/1998 | Hsia et al. | 438/254 |
| 5,903,430 A | 5/1999 | Takaishi | 361/301.4 |
| 5,998,260 A | 12/1999 | Lin | 438/254 |
| 6,027,968 A | * 2/2000 | Nguyen et al. | 438/254 |
| 6,030,879 A | 2/2000 | Huang et al. | 438/397 |
| 6,064,085 A | 5/2000 | Wu | 257/296 |
| 6,100,129 A | * 8/2000 | Tu et al. | 438/238 |
| 6,114,201 A | 9/2000 | Wu | 438/254 |
| 6,127,220 A | 10/2000 | Lange et al. | 438/254 |
| 6,133,600 A | 10/2000 | Sandhu | 257/308 |
| 6,271,084 B1 | * 8/2001 | Tu et al. | 438/253 |

* cited by examiner

Primary Examiner—Evan Pert
Assistant Examiner—Scott B. Geyer
(74) Attorney, Agent, or Firm—George O. Saile; Stephen B. Ackerman (57) ABSTRACT

A process for fabricating an alternate fin type capacitor structure, used to increase capacitor surface area has been developed. The process features the formation of fin shaped, storage node structures, located in fin type capacitor openings, which are in turn defined in a group of composite insulator layers. A first fin type capacitor opening is formed by selectively creating lateral recesses in first type insulator layers, exposed in a first capacitor opening in the composite insulator layers, while an adjacent, second fin type capacitor opening is formed by selectively creating lateral recesses in second type insulator components, exposed in a second capacitor opening located in the same composite insulator layers. Portions of the lateral recesses in the first and second fin type capacitor openings overlay, allowing intertwined or alternate, storage node structures to be realized, thus reducing the space needed for the capacitor structure. The horizontal features of the fin shaped storage node structure, located in the lateral recesses, result in increased capacitor surface area when compared to counterparts fabricated without the lateral recess component.

27 Claims, 8 Drawing Sheets

METHOD OF FABRICATING A DRAM DEVICE FEATURING ALTERNATE FIN TYPE CAPACITOR STRUCTURES

BACKGROUND OF THE INVENTION (1) Field of the Invention

The present invention relates to methods used to fabricate semiconductor devices, and more specifically to a method used to form capacitor structures for a dynamic random access memory (DRAM), device.

(2) Description of Prior Art

The reduction in DRAM cell size has limited the horizontal dimension of DRAM capacitor structures, thus adversely influencing the ability of the semiconductor industry to continually increase DRAM capacitance via use of wide capacitor structures. The use of capacitor structures featuring crown shaped, or fin shaped configurations, has allowed a portion of the desired capacitance increases to still be realized, however the shrinking dimensions of the underlying DRAM transfer gate transistors limit the horizontal dimensions of these capacitor structures, and thus limit capacitor surface area. Thus efforts have been directed at increasing capacitor surface area, via novel fin type capacitor configurations.

Vertical stacked capacitor structures featuring multiple horizontal fin type features, extending horizontally from a vertical capacitor feature that is used to contact an underlying storage node plug structure, has allowed the surface area of the capacitor structure to be increased thus increasing DRAM capacitance. This invention however will describe a process for fabricating a DRAM capacitor structure, comprised with alternate fin type structures, offering increased capacitor surface area, and using less horizontal space, when compared to counterpart, non-alternate fin type capacitor structures. The novel alternative fin type capacitor structure, described in this invention, is comprised of two storage node features, each located in a storage node opening, formed in a stack of composite insulator layers, each overlying and contacting a storage node plug structure. However each storage node opening is defined in the composite insulator layers, with each opening featuring lateral recesses in specific components of the composite insulator layers. The lateral recesses for a first storage node opening are formed in first type components of the composite insulator layers, while the lateral recesses in the second storage node opening are formed in second components of the composite insulator layers. Thus a storage node structure formed in these storage node openings, is comprised of intertwining features, located in the lateral recesses of the storage node openings. The subsequent capacitor structure is therefore comprised with alternate fin type, storage node structures, providing increased surface area in less horizontal space, when compared to counterpart non-alternate fin type structures. Prior art, such as Sandhu, in U.S. Pat. No. 6,133,600, as well as Takaishi, in U.S. Pat. No. 5,903,430, describe methods of fabricating fin type, capacitor structures, however these prior arts do not describe the novel process described in this present invention in which alternate type, DRAM capacitor structures are formed featuring lateral recesses, formed in specific components of a composite insulator layer.

SUMMARY OF THE INVENTION

It is an object of this invention to increase the surface area of a DRAM capacitor via use of an alternate, fin type capacitor configuration.

It is another object of this invention to define a first storage node opening in a group of composite insulator layers, then selectively form lateral recesses in first components of the composite insulator layers, followed by definition of a second storage node opening in the same group of composite insulator layers, then selectively form lateral recesses in second components of the composite insulator layers.

It is yet another object of this invention to form a storage node structure, located in the first, and in the second storage node openings, with the storage node structure featuring horizontal, fin type components, located in the lateral recesses of the storage node openings, and with the fin type features in the lateral recesses in the first storage node opening, intertwined with the fin type features in the lateral recesses in the second storage node opening.

In accordance with the present invention a method of fabricating an alternate fin type, DRAM capacitor structure, featuring intertwined storage node structures, is described. After formation of storage node plug structures, contacting source/drain regions of underlying DRAM transfer gate transistors, a series of composite insulator layers, each comprised with a layer of silicon nitride, silicon oxide, borophosphosilicate glass (BPSG), and silicon oxide, is deposited. A first storage node opening is formed in the series of composite insulator layers, exposing the top surface of a first storage node plug structure, followed by lateral recesses selectively formed in the silicon nitride component of each composite insulator layer. A second storage node opening is then formed in the series of composite insulator layers, exposing a second storage node plug structure, followed by lateral recesses selectively formed in the BPSG component of each composite insulator layer. The lateral recesses in the first storage node opening, partially overlays the lateral recesses in the second storage node openings, with these lateral recesses separated by the silicon oxide component of the composite insulator layers. Storage node structures are then formed in the storage node openings, coating the lateral recesses in these openings, resulting in the intertwined horizontal fin type features. After formation of a capacitor dielectric layer on the storage node structures, a capacitor top plate is formed integrating the storage node structures, resulting in an alternate fin type, DRAM capacitor structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
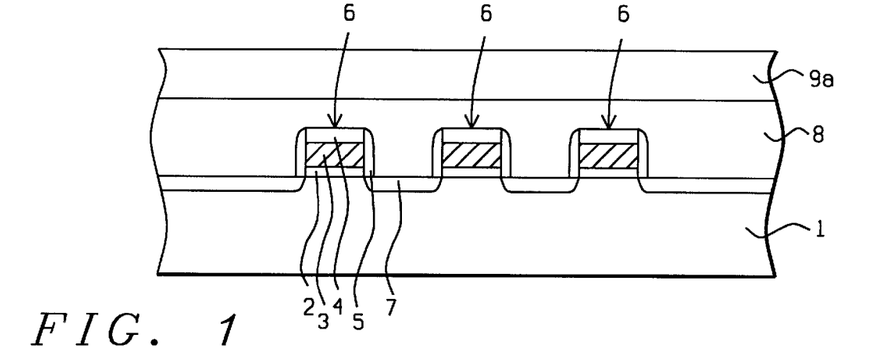
FIGS. 1, 2A, 2B, 3–9, which schematically, in cross-sectional style, describe key stages of fabrication used to form an alternate fin type, capacitor structure.

The process of fabricating an alternate fin type capacitor structure, featuring storage node structures comprised with horizontal features which are located in lateral recesses in storage node openings, will now be described in detail. A, P-type semiconductor substrate 1, comprised of single crystalline silicon, with a<100> crystallographic orientation, is used and schematically shown in FIG. 1. Gate insulator layer 2, comprised of silicon dioxide, is next thermally grown to a thickness between about 50 to 150 Angstroms. Polysilicon layer 3, is then deposited via low pressure chemical vapour deposition (LPCVD), procedures, at a thickness between about 500 to 2000 Angstroms. Polysilicon layer 3, is either doped in situ via the addition of arsine, or phosphine to a silane ambient, or polysilicon layer 3, is deposited intrinsically then doped via implantation of arsenic or phosphorous ions. If desired a polycide layer, comprised of an overlying tungsten silicide layer, and an underlying doped polysilicon layer, can be used in place of polysilicon to lower the resistance of a subsequent word line. Silicon nitride layer 4, is next deposited, via LPCVD or via plasma enhanced chemical vapour deposition (PECVD), procedures, at a thickness between about 500 to 1000 Angstroms. Conventional photolithographic and anisotropic reactive ion etching (RIE) procedure, are used to define silicon nitride capped gate structures 6, shown schematically in FIG. 6. The silicon nitride capped gate structures are used as word lines for the DRAM device. After removal of the photoresist shape used for definition of silicon nitride capped gate structure 6, insulator spacers 5 are formed on the sides of silicon nitride capped gate structure 6, via the deposition of an insulator layer such as silicon oxide or silicon nitride, using LPCVD or PECVD procedures, a thickness between about 500 to 1000 Angstroms, followed by a blanket, anisotropic RIE procedure, using $CF_4$ as an etchant. Source/drain regions 7, are then formed in regions of semiconductor substrate 1, not covered by the silicon capped gate structures 6, or by insulator spacers 5, via implantation of arsenic or phosphorous ions, at an energy between about 10 to 30 KeV, and at a dose between about 1E13 to 1E14 atoms/$cm^2$. The result of these procedures is schematically shown in FIG. 1.

Figure 2A:
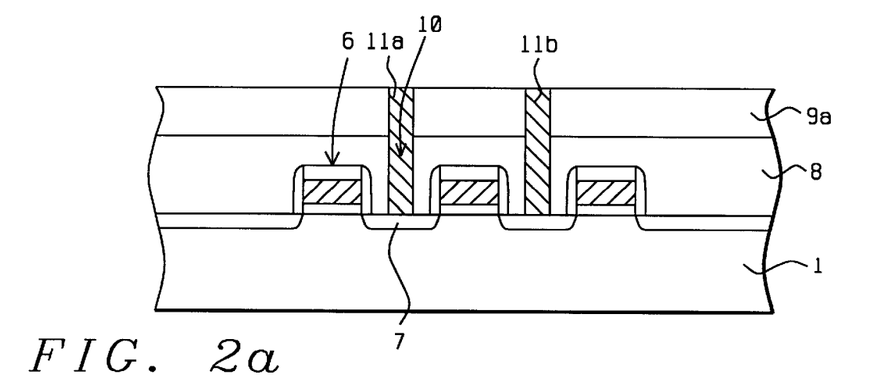
Figure 2B:
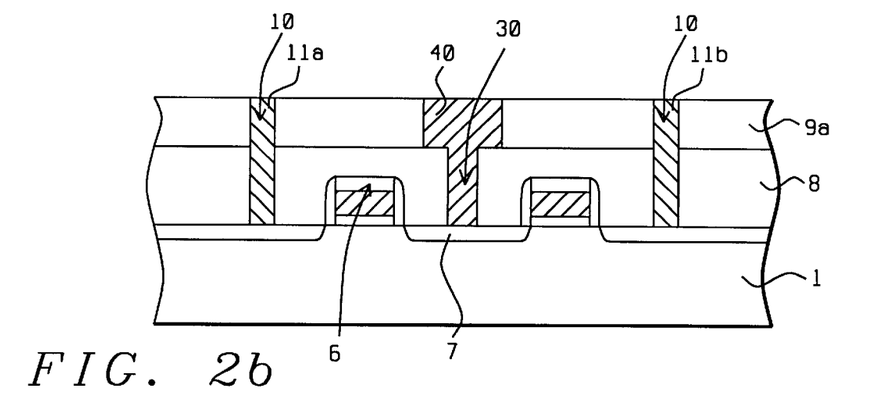

Silicon oxide layer 8, is next deposited at a thickness between about 5000 to 10000 Angstroms via a high density plasma (HDP) procedure or via LPCVD or PECVD procedures, using tetraethylorthosilicate (TEOS) as a source. To obtain a smooth top surface topography, a chemical mechanical polishing (CMP) procedure is employed for planarization. Silicon nitride layer 9a, shown schematically in FIG. 1, is then deposited on the planarized top surface of silicon oxide layer 8, via LPCVD or PECVD procedures, at a thickness between about 2000 to 3000 Angstroms. Photolithographic and anisotropic RIE procedures are next employed to define openings 10, in silicon nitride layer 9a, and in silicon oxide layer 8, using $CF_4$ as an etchant for silicon nitride layer 9a, while using $CHF_3$ as an etchant for silicon oxide layer 8. Openings 10, expose regions of source/drain regions 7. After removal of the photoresist shape, used to define openings 10, storage node plug structures 11a, and 11b, are formed in openings 10. This is accomplished via deposition of a conductive layer, such as an arsenic or phosphorous, in situ doped polysilicon layer, using LPCVD procedures at a thickness between about 2000 to 3000 RIE procedure, using $Cl_2$ as an etchant for polysilicon, resulting in storage node structures 11a, and 11b, in openings 10. This is schematically shown in FIG. 2A. If desired storage node plug structures can be comprised of tungsten or tungsten silicide. In addition bit line structure 40, shown schematically in FIG. 2B, is formed between gate structures, and subsequent capacitor structures. However to concentrate on the novel capacitor structures described in this invention, and to maintain simplicity in the subsequent drawings, bit line structure will only be illustrated in FIG. 2B, although included as part of the final DRAM device. Bit line contact hole 30, a dual damascene type opening, is formed in silicon nitride layer 9a, and in silicon oxide layer 8, followed by deposition of the conductive layer, and the CMP or RIE procedure, resulting in the dual damascene bit line structure 40, in opening 30.

Figure 3:
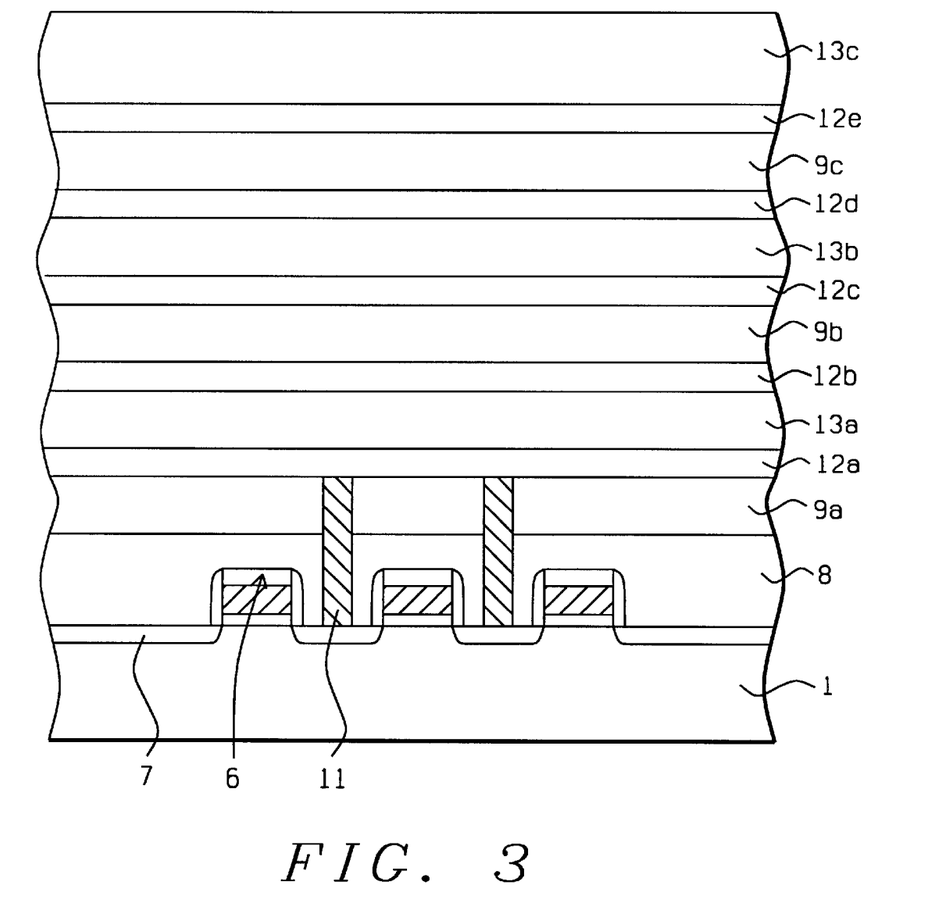

A stack of insulator layers, comprised with layers of: PETEOS silicon oxide, borophosphosilicate glass (BPSG); and silicon nitride, are next deposited and shown schematically in FIG. 3. A first group of insulator layers, comprised of silicon oxide layer 12a, BPSG layer 13a, silicon oxide layer 12b, and silicon nitride layer 9b, is formed on the top surface of silicon nitride layer 9a, and on the top surface of storage node plug structures 11a, and 11b. Silicon oxide layers 12a, and 12b, are obtained at a thickness between about 500 to 1000 Angstroms, via HDP or PECVD procedures, using TEOS as a source. BPSG layer 13a, at a thickness between about 2000 to 3000 Angstroms, is obtained via PECVD procedures, using TEOS a source, with the addition of diborane and phosphine. Silicon nitride layer 9b, is obtained at a thickness between about 2000 to 3000 Angstroms, using PECVD or LPCVD procedures. A second group of insulator layers, comprised of silicon oxide layer 12c, BPSG layer 13b, silicon oxide layer 12d, and silicon nitride layer 9c, is next formed, using identical thicknesses and deposition procedures, used for the comparable components in the first group of insulator layers. Finally a third group of insulator layers, comprised of silicon oxide layer 12e, and BPSG layer 13c, is formed on the top surface of the second group of insulator layers. Silicon oxide layer 12e, is again a PETEOS silicon oxide layer, again obtained via PECVD or HDP procedures, at a thickness between about 500 to 1000 Angstroms, while BPSG layer 13c, is deposited to a thickness between about 2000 to 3000 Angstroms, via PECVD procedures, identical to weight percents previously used for BPSG layers 13a, and 13b. The mode of deposition for the silicon oxide layers, as well as the weight percents of the BPSG layers, will be critical for selective wet etching characteristics, to subsequently be employed to define a specific capacitor opening shape.

Figure 4:
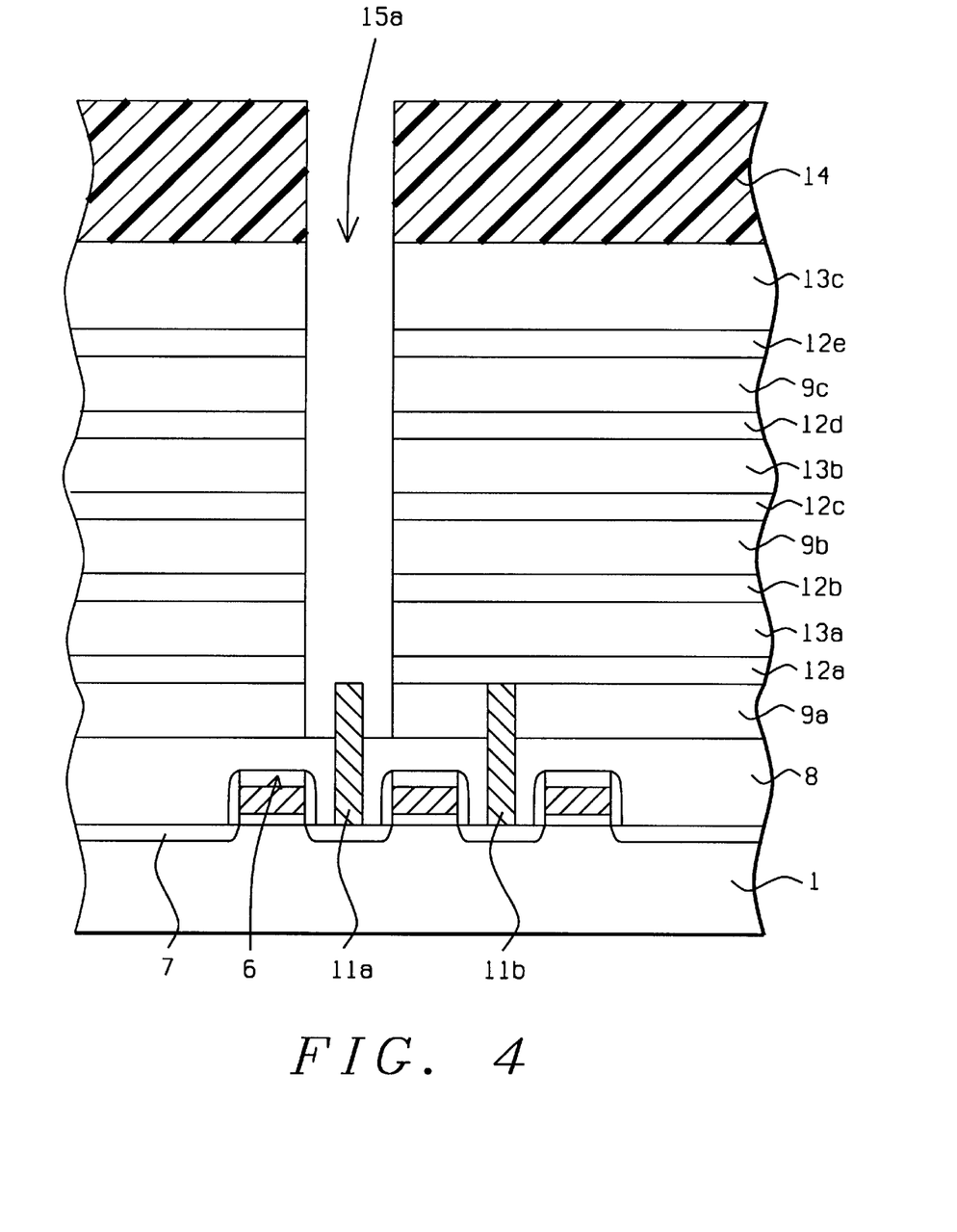
Figure 5:
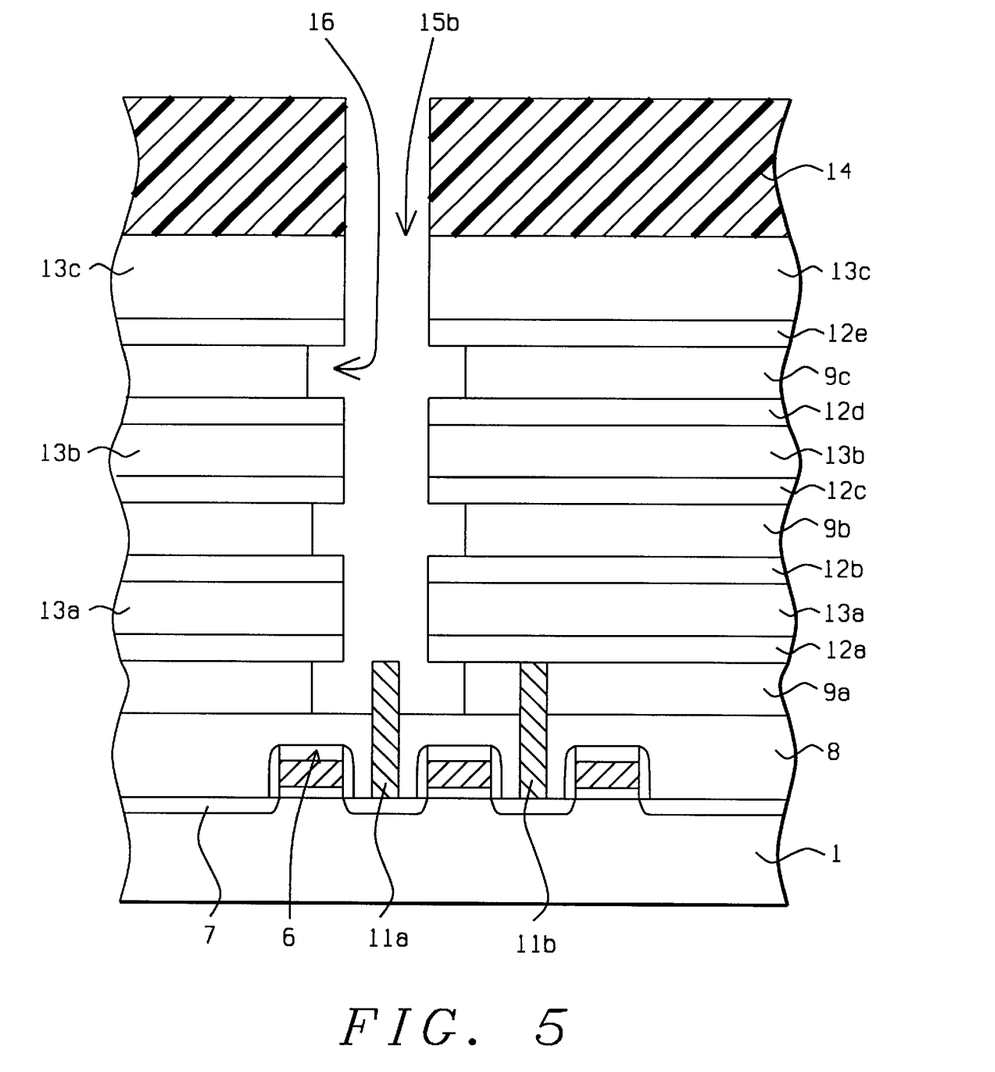

A first capacitor opening, or storage node opening 15a, schematically shown in FIG. 4, is next defined in the multiple insulator layers. Photoresist shape 14 is used as an etch mask to allow an anisotropic RIE procedure, using $C_4F_8$ as an etchant for BPSG layers 13c, 13b, and 13a, as well as for silicon oxide layers 12e, 12d, 12c, 12b, and 12a, while $CH_3F$ is used as an etchant for silicon nitride layers 9c, 9b, and 9a. The selective etchant used for silicon nitride layer 9a, allows the procedure to terminate at the appearance of silicon oxide layer 8, exposing the top portion of storage node plug structure 11a. The width, or diameter of capacitor opening 15a, is between about 0.3 to 0.4 um. With photoresist shape 14 still in place, a selective wet etch procedure using $H_3PO_4$ as an etchant, at a temperature between about 160 to 165° C., is used to pull back, or to create lateral recess 16, in the silicon nitride components of the insulator stack. This is schematically shown in FIG. 5. Lateral recesses 16 extend between about 2000 to 3000 Angstroms into silicon nitride layers 9a, 9b, and 9c, resulting in fin type capacitor opening 15b, featuring lateral recesses 16 in the silicon nitride layers, responsible for the horizontal fin type features. Photoresist shape 14 is then removed via plasma oxygen ashing and careful wet clean procedures. This procedure was attainable as a result of the high etch rate of silicon nitride, in $H_3PO_4$, when compared to the lower etch rates of silicon oxide, or BPSG in $H_3PO_4$.

Figure 6:
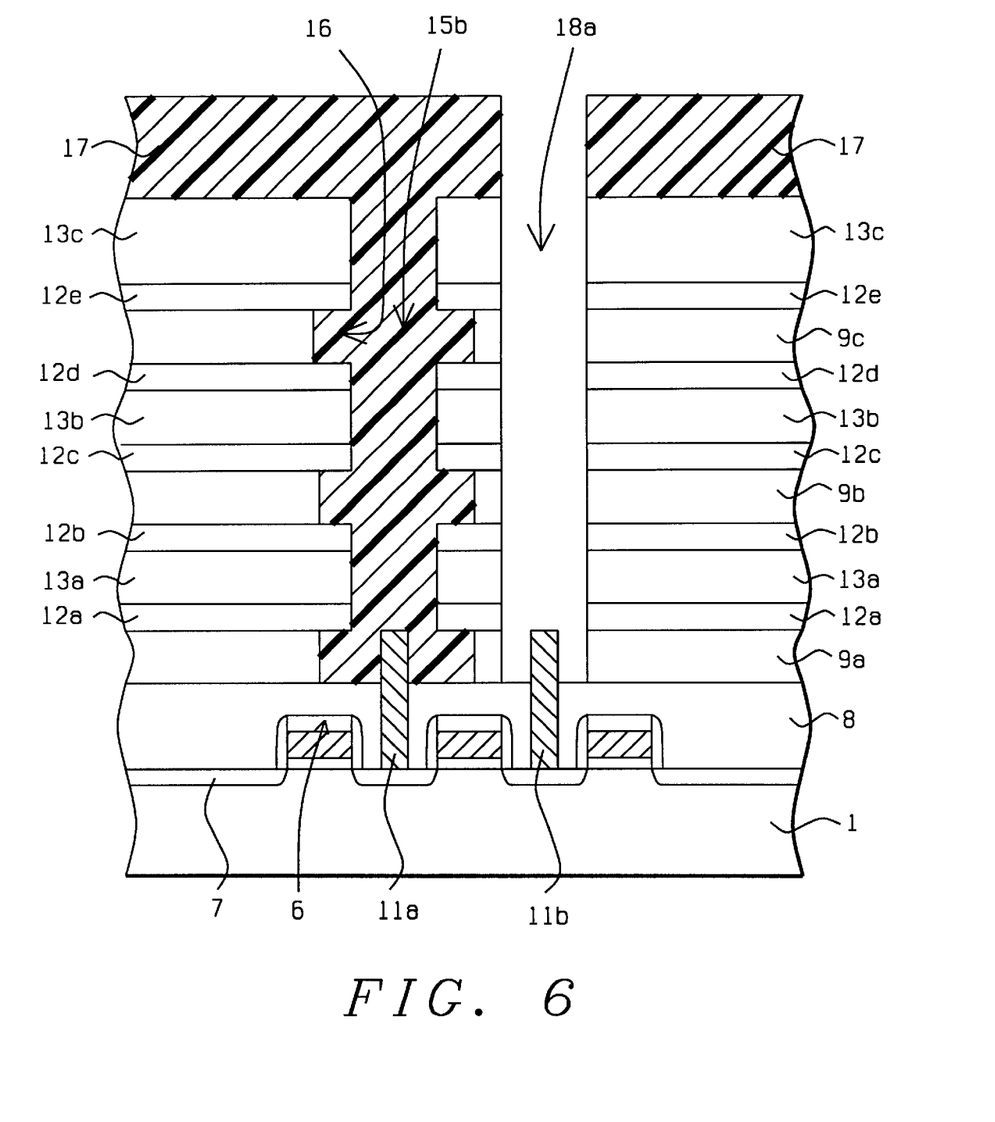
Figure 7:
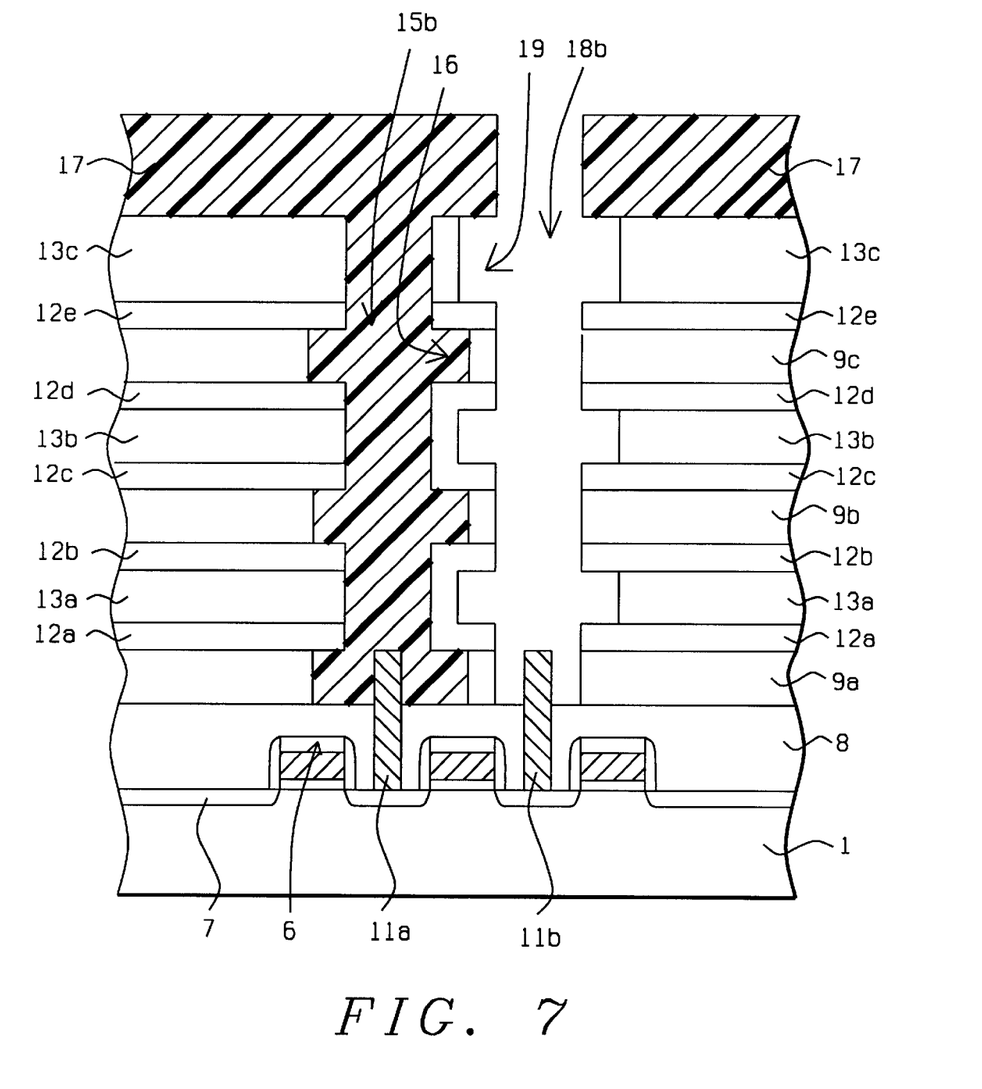

Photoresist shape 17 is now employed as an etch mask to define a second capacitor opening, or storage node opening 18a, in the multiple insulator layers, while completely filling, and thus protecting, fin type, capacitor opening 5b, from subsequent dry etch procedures used to define the second capacitor opening. An anisotropic RIE procedure, identical to the procedure previously used to define first capacitor opening 15a, is again employed for definition of second capacitor opening 18a. The anisotropic RIE procedure, using $C_4F_8$ as an etchant for BPSG and silicon oxide components, and using $CH_3F$ as an etchant for the silicon nitride components, allow second capacitor opening 18a, comprised with a width, or diameter between about 0.3 to 0.4 um, to be defined in the multiple insulator layers, exposing a top portion of storage node plug structure 11b. This is schematically shown in FIG. 6. A dry etch, HF vapour procedure is then used to selectively form lateral recesses in BPSG layers 13c, 13b, and 13a, while undoped silicon oxide layers (12a–12e), remain unetched, resulting in fin type, capacitor opening 18b. This is schematically shown in FIG. 7. Lateral recesses 19, extend horizontally between about 2000 to 3000 Angstroms into the BPSG layers. In regions in which fin type capacitor opening 15b and fin type capacitor opening 18b are adjacent, lateral recesses 16 in silicon nitride layers and lateral recesses 19 in BPSG layers overlap or are intertwined. This can be seen schematically in FIG. 7. Photoresist shape 17 is then removed via plasma oxygen ashing and careful wet clean procedures. This result, the formation of lateral recesses in BPSG, was accomplished as a result of the high etch rate of BPSG in HF vapour, compared to the lower etch rates of silicon oxide, or silicon nitride, exposed to the same HF vapour. If desired, definition of fin type capacitor opening 18b can be performed prior to definition of fin type capacitor opening 15b.

Figure 8:
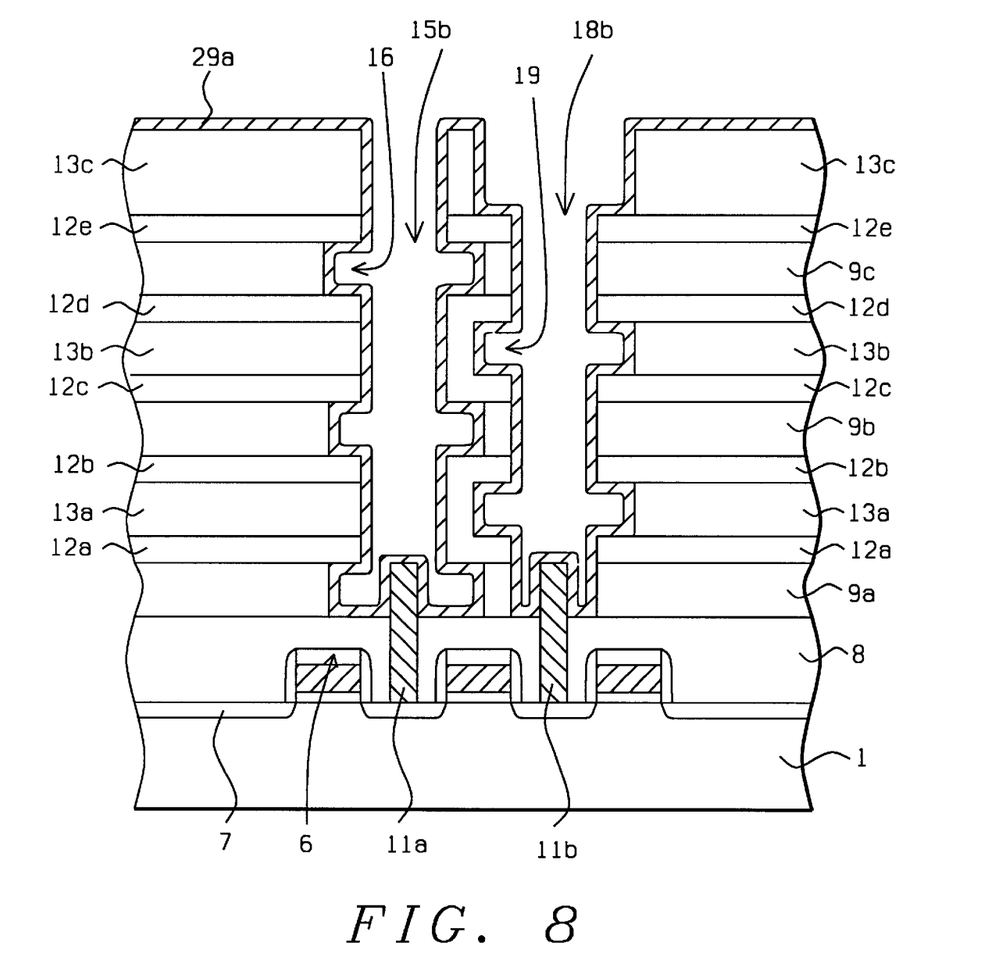
Figure 9:
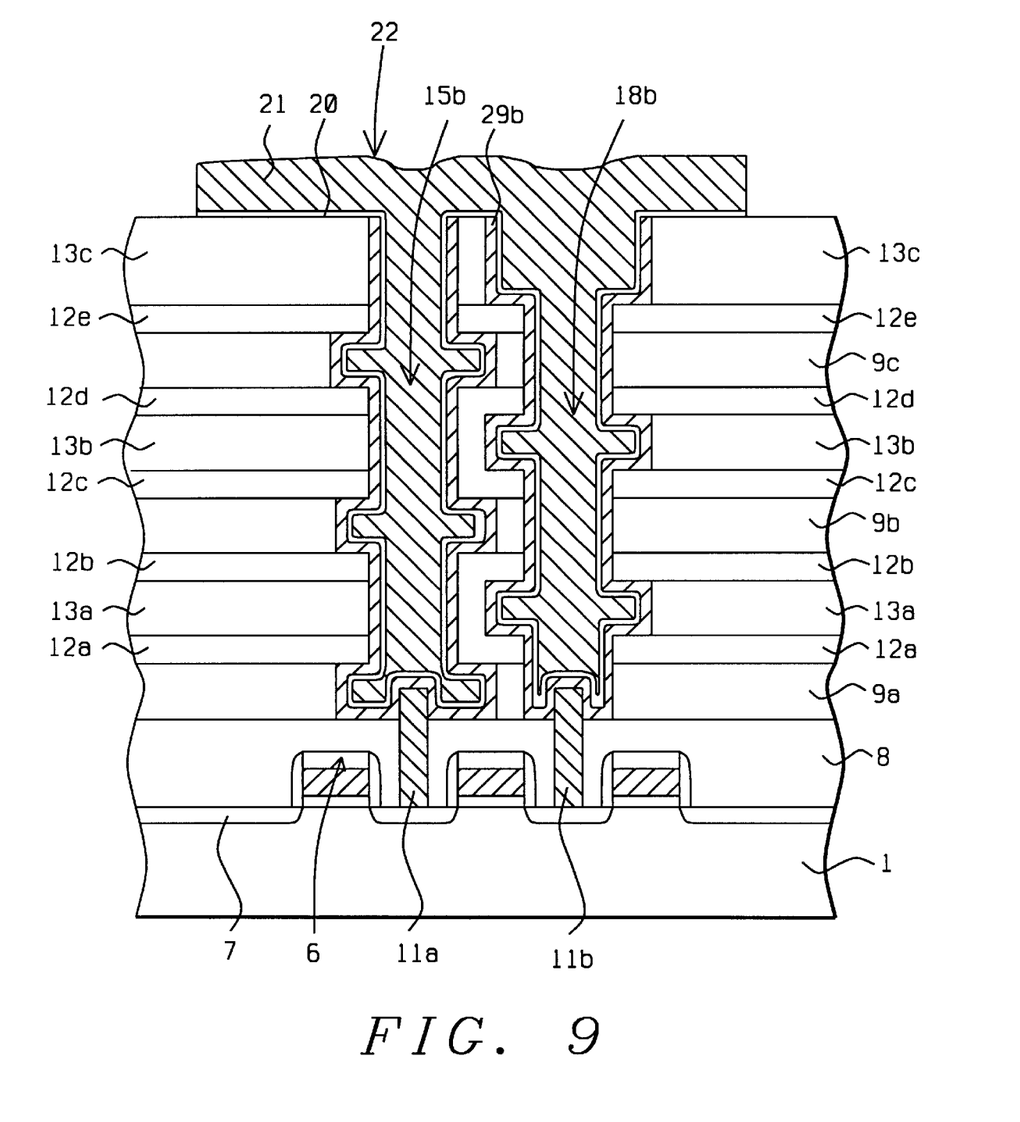

The formation of a bottom plate, or a storage node structure, for the DRAM capacitor structure, is next addressed and schematically described in FIGS. 8–9. A polysilicon layer 29a is deposited via LPCVD procedures, to a thickness between about 500 to 1000 Angstroms. The LPCVD mode of deposition results in a conformal polysilicon layer, easily contouring the surfaces of lateral recesses 16 of fin type capacitor opening 15b and lateral recesses 19 of fin type capacitor opening 18b. This is schematically shown in FIG. 8. Polysilicon layer 29a, is in situ doped, during deposition, via the addition of arsine or phosphine to a silane ambient. If desired, to further increase subsequent storage node surface area, a rugged, or hemispherical grained silicon layer can be used in place of polysilicon layer 29a, or the rugged silicon layer can be used overlying polysilicon layer 29a.

A CMP procedure is next employed to remove regions of polysilicon layer 29a from the top surface of BPSG layer 13c creating storage node structures, or bottom plate structures 29b, for the DRAM capacitor structure. The creation of the lateral recesses in the fin type capacitor openings, and the ability of conformal polysilicon to form a continuous layer in the same lateral recesses, result in storage node structures with increased surface area when compared to counterparts fabricated without the lateral recesses in the capacitor openings. A capacitor dielectric layer 20, such as oxidized nitride on oxide (ONO), nitride-oxide (NO), or tantalum oxide ($Ta_2O_5$), is next formed at a thickness between about 50 to 100 Angstroms, on the storage node structures 29b. This is schematically shown in FIG. 9. Top plate structure 21 is then formed, via deposition of a conductive material such as in situ doped polysilicon, at a thickness between about 1000 to 1500 Angstroms, using LPCVD procedures. The polysilicon layer results in the filling of the lateral recesses, as well as the complete filling of both fin type capacitor openings. If desired a metal layer can be used as the material for the capacitor top plate structure. Conventional photolithographic and RIE procedures, using $Cl_2$ as an etchant for polysilicon, are used to define top plate structure 21, schematically shown in FIG. 9. The resulting capacitor structure 22, comprised of top plate structure 21, capacitor dielectric layer 20, and storage node structures 29b, provide increased capacitance as a result of the fin type storage node structures, which in turn provide the additional surface area as a result of the lateral recesses in the fin type capacitor openings. In addition, the concept of intertwining the storage node structures enable less horizontal space to be consumed when compared to counterpart designs not using the intertwined storage node structures. The ability to intertwine these structures was accomplished via formation of lateral recesses in the capacitor openings, which in turn was accomplished via selective wet and dry etching of specific components of a multiple insulator stack.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a capacitor structure for a dynamic random access memory (DRAM), device, on a semiconductor substrate, comprising the steps of:

providing transfer gate transistor structures, on said semiconductor substrate, comprised of word line structures, with source/drain regions located in a region of said semiconductor substrate not covered by said word line structures, and providing storage node plug structures, overlying and contacting said source/drain regions;

depositing a group of composite insulator layers, with each composite insulator layer comprised of an underlying first type insulator layer, a second type insulator layer, an overlying first type insulator layer, and an overlying third type insulator layer;

forming a first capacitor opening in a first region of said group of composite insulator layers, exposing a top portion of a first storage node plug structure;

selectively forming lateral recesses in said third type insulator layer of said group of composite insulator layers, exposed in said first capacitor opening, resulting in a first fin type capacitor opening, forming a second capacitor opening in a second region of said group of composite insulator layers, exposing a top portion of a second storage node plug structure;

selectively forming lateral recesses in said second type insulator layer of said group of composite insulator layers, exposed in said second capacitor opening, resulting in a second fin type capacitor opening;

forming storage node structures in said first fin type capacitor opening, and in said second fin type capacitor opening;

forming a capacitor dielectric layer on said storage node structures; and forming a top plate structure, resulting in a said capacitor structure comprised of said top plate structure, of said capacitor dielectric layer, and of said storage node structures located in said first fin type capacitor opening, and in said second fin type capacitor opening.

2. The method of claim 1, wherein said first type insulator layer is a silicon oxide layer, obtained at a thickness between about 500 to 1000 Angstroms via high plasma deposition (HDP), or via plasma enhanced chemical vapour deposition (PECVD) procedures, using tetraethylorthosilicate (TEOS) as a source.

3. The method of claim 1, wherein said second type insulator layer is a borophosphosilicate glass (BPSG) layer, obtained at a thickness between about 2000 to 3000 Angstroms via PECVD procedures.

4. The method of claim 1, wherein said third type insulator layer is a silicon nitride layer, obtained via PECVD or low pressure chemical vapour deposition (LPCVD) procedures at a thickness between about 2000 to 3000 Angstroms.

5. The method of claim 1, wherein said first capacitor opening and said second capacitor opening are formed in said group of composite insulator layers via an anisotropic RIE procedure, using $C_4F_8$ as an etchant for said first type insulator layer and for said second type insulator layer, while using $CH_3F$ as an etchant for said third type insulator layer.

6. The method of claim 1, wherein the width or diameter of said first capacitor opening and of said second capacitor opening is between about 0.3 to 0.4 Angstroms.

7. The method of claim 1, wherein said lateral recesses in said third type insulator layer, located in said first fin type capacitor opening, are formed via a selective wet etch procedure using $H_3PO_4$ as an etchant, at a temperature between about 160 to 165° C.

8. The method of claim 1, wherein said lateral recesses in said third type insulator layer, located in said first fin type capacitor opening, are between about 2000 to 3000 Angstroms in length.

9. The method of claim 1, wherein said lateral recesses in said second insulator layer, in said second fin type capacitor opening, are formed via a selective dry procedure, using HF vapour as an etchant.

10. The method of claim 1, wherein said lateral recesses in said second type insulator layer, located in said second fin type capacitor opening, are between about 2000 to 3000 Angstroms in length.

11. The method of claim 1, wherein said storage node structures are comprised of doped polysilicon, obtained via LPCVD procedures, at a thickness between about 500 to 1000 Angstroms, and in situ doped during deposition via the addition of arsine or phosphine to a silane ambient.

12. The method of claim 1, wherein said capacitor dielectric layer, at a thickness between about 50 to 100 Angstroms, is chosen from a group that contains nitride-oxide (NO), oxidized nitride on oxide (ONO), or tantalum oxide.

13. The method of claim 1, wherein said top plate structure is comprised of in situ doped polysilicon, deposited via LPCVD procedures to a thickness between about 1000 to 1500 Angstroms, and defined via photolithographic and RIE procedures.

14. A method of fabricating an alternate fin type configuration for a DRAM capacitor structure, on a semiconductor substrate, comprising the steps of:

providing transfer gate transistors comprised of polycide word line structures on an underlying gate insulator layer, insulator spacers on the sides of said polycide word line structures, and source/drain regions located in an area of said semiconductor substrate not covered by said polycide word line structures;

forming a planarized silicon oxide layer;

depositing a first silicon nitride layer on said planarized silicon oxide layer;

forming storage node plug structures, in storage node openings, located in said first silicon nitride layer, and in said planarized silicon oxide layer, with said storage node structures overlying and contacting said source/drain regions;

depositing a first composite insulator layer, comprised of an underlying first silicon oxide layer, a first BPSG layer, a second silicon oxide layer, and an overlying second silicon nitride layer;

depositing a second composite insulator layer, comprised of an underlying third silicon oxide layer, a second BPSG layer, a fourth silicon oxide layer, and an overlying third silicon nitride layer;

depositing a third composite insulator layer, comprised of an underlying fifth silicon oxide layer, and a third BPSG layer;

forming a first capacitor opening in a first region of said third composite insulator layer, in a first region of said second composite insulator layer, in a first region of said first composite insulator layer, and in a first region of said first silicon nitride layer, exposing a top portion of a first storage node plug structure;

performing a selective wet etch procedure to form lateral recesses in regions of said third silicon nitride layer, in regions of said second silicon nitride layer, and in regions of said first silicon nitride layer, exposed in said first capacitor opening, resulting in creation of a first fin type capacitor opening;

forming a second capacitor opening in a second region of said third composite insulator layer, in a second region of said second composite insulator layer, in a second region of said first composite insulator layer, and in a second region of said first silicon nitride layer, exposing a top portion of a second storage node structure;

performing a selective dry etch procedure to form lateral recesses in regions of said third BPSG layer, in regions of said second BPSG layer, and in regions of said first BPSG layer, exposed in said second capacitor opening, resulting in creation of a second fin type capacitor opening;

depositing a doped polysilicon layer coating the exposed surfaces of said first fin type capacitor opening, and of said second fin type capacitor opening;

performing a chemical mechanical polishing procedure to remove portions of said doped polysilicon layer from the top surface of said third composite insulator layer, resulting in the definition of a first fin type storage node structure located in said first fin type capacitor opening, and resulting in the definition of a second fin type storage node structure located in said second fin type capacitor opening;

forming a capacitor dielectric layer on said first fin type, storage node structure, and on said second fin type, storage node structure;

depositing a conductive layer, completely filling said first fin type capacitor opening structure, and said second fin type capacitor opening; and patterning of said conductive layer to define a top plate structure, resulting in said alternate fin type capacitor structure comprised of said top plate structure on said capacitor dielectric layer, overlying said first fin type storage node structure and said second fin storage node structure, with a portion of said horizontal features of said first fin storage node structure, formed in said lateral recesses in said first fin type capacitor opening, partially overlying a portion of horizontal features of said second fin type storage node structure, formed in said lateral recesses in said second fin type capacitor opening.

15. The method of claim 14, wherein said planarized silicon oxide layer, is a silicon oxide layer obtained using either high density plasma (HDP), plasma enhanced chemical vapour deposition (PECVD) or low pressure chemical vapour deposition (LPCVD) procedures, at a thickness between about 5000 to 10000 Angstroms, using tetraethylorthosilicate (TEOS) as a source, then planarized via a chemical mechanical polishing procedure.

16. The method of claim 14, wherein said first silicon nitride layer, said second silicon nitride layer, and said third silicon nitride layer, are obtained via PECVD or low pressure chemical vapour deposition (LPCVD) procedures at a thickness between about 2000 to 3000 Angstroms.

17. The method of claim 14, wherein said first silicon oxide layer, said second silicon oxide layer, said third silicon oxide layer, said fourth silicon oxide layer and said fifth silicon oxide layer are obtained at a thickness between about 500 to 1000 Angstroms via HDP or PECVD procedures, using TEOS as a source.

18. The method of claim 14, wherein said first borophosphosilicate glass (BPSG) layer, said second BPSG layer and said third BPSG layer are obtained at a thickness between about 2000 to 3000 Angstroms via PECVD procedures.

19. The method of claim 14, wherein said first capacitor opening and said second capacitor opening are formed in said third composite insulator layer, in said second composite insulator layer, in said first composite insulator layer and in said first silicon nitride layer, via an anisotropic RIE procedure, using $C_4F_8$ as an etchant for silicon oxide layers and for BPSG layers while using $CH_3F$ as an etchant for silicon nitride layers.

20. The method of claim 14, wherein the width or diameter of said first capacitor opening and of said second capacitor opening is between about 0.3 to 0.4 um.

21. The method of claim 14, wherein said lateral recesses in the silicon nitride layers, in said first fin type capacitor opening, are formed via a selective wet etch procedure using $H_3PO_4$ as an etchant, at a temperature between about 160 to 165° C.

22. The method of claim 14, wherein said lateral recesses in the silicon nitride layers, in said first fin type capacitor opening, are between about 2000 to 3000 Angstroms in length.

23. The method of claim 14, wherein said lateral recesses in the BPSG layers, in said second fin type capacitor opening, are formed via a selective dry procedure, using HF vapour as an etchant.

24. The method of claim 14, wherein said lateral recesses in the BPSG layers, in said second fin type capacitor opening, are between about 2000 to 3000 Angstroms in length.

25. The method of claim 14, wherein said doped polysilicon layer, used for said storage node structures, is obtained via LPCVD procedures, at a thickness between about 500 to 1000 Angstroms, and in situ doped during deposition via the addition of arsine or phosphine to a silane ambient.

26. The method of claim 14, wherein said capacitor dielectric layer, at a thickness between about 50 to 100 Angstroms, is chosen from a group that contains nitride-oxide (NO), oxidized nitride on oxide (ONO), or tantalum oxide.

27. The method of claim 14, wherein said conductive layer used to form said top plate structure is a doped polysilicon layer, obtained via LPCVD procedures, at a thickness between about 1000 to 1500 Angstroms.

* * * * *